(12) United States Patent
Choi et al.

(10) Patent No.: US 10,685,203 B2
(45) Date of Patent: Jun. 16, 2020

(54) HIGH-PERFORMANCE FILM-TYPE TOUCH SENSOR AND METHOD OF FABRICATING THE SAME

(71) Applicant: DONGWOO FINE-CHEM CO., LTD., Iksan-si, Jeollabuk-do (KR)

(72) Inventors: Yong Seok Choi, Yongin-si (KR); Seung Kook Kim, Seoul (KR); Ju In Yoon, Pyeongtaek-si (KR); Soo Ho Cho, Hwaseong-si (KR)

(73) Assignee: DONGWOO FINE-CHEM CO., LTD., Iksan-si (KR)

( * ) Notice: Subject to any disclaimer, the term of this patent is extended or adjusted under 35 U.S.C. 154(b) by 209 days.

(21) Appl. No.: 15/876,422

(22) Filed: Jan. 22, 2018

(65) Prior Publication Data
US 2018/0211082 A1   Jul. 26, 2018

(30) Foreign Application Priority Data
Jan. 23, 2017 (KR) ........................ 10-2017-0010228

(51) Int. Cl.
*G06K 9/00* (2006.01)
*G06F 3/044* (2006.01)
*H05K 3/00* (2006.01)

(52) U.S. Cl.
CPC ........... *G06K 9/0002* (2013.01); *G06F 3/044* (2013.01); *G06F 2203/04102* (2013.01);
(Continued)

(58) Field of Classification Search
CPC .................. G06K 9/0002; G06F 3/044; G06F 2203/04103; G06F 2203/04111; H05K 3/007
See application file for complete search history.

(56) References Cited

U.S. PATENT DOCUMENTS 7,101,627 B2 *  9/2006  MacDonald ............ B29C 55/06
                                                   257/E51.001
7,641,957 B2 *  1/2010  Robinson ............... H05B 33/14
                                                   428/141
(Continued)

FOREIGN PATENT DOCUMENTS

JP          2001-332132 A       11/2001
KR     10-2015-0040865           4/2015
(Continued)

OTHER PUBLICATIONS

Notification of Grounds for Rejection from counterpart Korean Patent Appln. No. 10-2017-0010228, dated May 29, 2019, and its English translation.

*Primary Examiner* — Gregory M Desire
(74) *Attorney, Agent, or Firm* — DLA Piper LLP (US)

(57) ABSTRACT

The present invention relates to a high-performance film-type touch sensor that has a low sheet resistance and can have a high resolution, a large area, and a small thickness, and a method of fabricating the same. In the high-performance film-type touch sensor which is peeled off from a substrate and to which a base film is bonded, at least a separation layer, an electrode pattern layer, and a protection layer are sequentially stacked on the base film, and one or more of first and second electrode patterns arranged in different directions on the separation layer are formed of a plurality of conductive layers to reduce sheet resistance.

14 Claims, 8 Drawing Sheets

(52) U.S. Cl.
CPC ............. *G06F 2203/04103* (2013.01); *G06F 2203/04111* (2013.01); *H05K 3/007* (2013.01); *H05K 2201/10151* (2013.01)

(56) References Cited

U.S. PATENT DOCUMENTS

| | | | |
|---|---|---|---|
| 8,963,144 B2 * | 2/2015 | Sakaguchi | H01L 51/5253 257/40 |
| 9,142,573 B1 * | 9/2015 | Yamashita | G02F 1/136213 |
| 9,920,421 B2 * | 3/2018 | Lotz | H05K 3/00 |
| 9,933,903 B2 * | 4/2018 | Miyake | G06F 3/044 |
| 10,031,630 B2 * | 7/2018 | Ishizaki | G06F 3/044 |
| 2008/0012151 A1 * | 1/2008 | Kemppainen | H01L 51/0021 257/786 |
| 2012/0319116 A1 * | 12/2012 | Ono | H01L 27/3276 257/59 |
| 2016/0293771 A1 * | 10/2016 | Long | H01L 27/1222 |
| 2017/0273624 A1 * | 9/2017 | Liu | A61B 5/01 |

FOREIGN PATENT DOCUMENTS

| | | |
|---|---|---|
| KR | 10-2015-0132689 | 11/2015 |
| KR | 101586736 B1 | 1/2016 |
| KR | 2016-0067666 A | 6/2016 |

* cited by examiner

| IZO/Ag alloy/IZO THICKNESS | IZO/Ag alloy/IZO RESISTANCE | IZO/Ag alloy/IZO TRANSMITTANCE | IZO/Ag alloy/IZO REFLECTIVITY | IZO/Ag alloy/IZO Pattern 3um /5um TRANSMITTANCE |
|---|---|---|---|---|
| 30nm/10nm/30nm | 10 | 75 | 7 | >90% |
| 30nm/15nm/30nm | 6 | 67 | 17 | >90% |

| ITO/Ag alloy/ITO THICKNESS | ITO/Ag alloy/ITO RESISTANCE | ITO/Ag alloy/ITO TRANSMITTANCE | ITO/Ag alloy/ITO REFLECTIVITY | ITO/Ag alloy/ITO Pattern 3um /5um TRANSMITTANCE |
|---|---|---|---|---|
| 30nm/10nm/30nm | 10 | 65 | 7 | >90% |
| 30nm/15nm/30nm | 6 | 58 | 17 | >90% |

FIG. 4

HIGH-PERFORMANCE FILM-TYPE TOUCH SENSOR AND METHOD OF FABRICATING THE SAME

CROSS-REFERENCE TO RELATED PATENT APPLICATION

This U.S. non-provisional patent application claims priority under 35 U.S.C. § 119 of Korean Patent Application No. 10-2017-0010228 filed on Jan. 23, 2017 in the Korean Patent Office, the entire contents of which are hereby incorporated by reference.

FIELD OF INVENTION

The present invention relates to a touch sensor. More particularly, the present invention relates to a high-performance film-type touch sensor that has a low sheet resistance and can have a high resolution, a large area, and a small thickness.

BACKGROUND

In the displays of electronic devices such as personal digital assistants (PDAs), laptop computers, office automation (OA) equipment, medical devices, car navigation systems, and the like, touch sensors are provided as an input means. Touch sensors can be classified into a resistive type, an electromagnetic induction type, an optical type, a capacitive type, and the like according to implementation methods thereof.

For example, as shown in FIG. 1, a capacitive-type touch sensor can be divided into a display region and a non-display region according to whether visual information is displayed.

The display region is intended to display an image provided by a device combined with the touch sensor, and also to sense a touch signal input by a user in a capacitive manner. In the display region, an electrode pattern layer 40 (also referred to as a touch sensor layer) including a plurality of electrode patterns 41 and 42 formed in directions crossing each other is formed.

Meanwhile, in the non-display region lying outside the display region, a connection line portion 20 (also referred to as a trace portion) electrically connected to the electrode pattern layer 40 and a pad portion 30 electrically connected to the connection line portion 20 are formed.

In the touch sensor having the above-described configuration, indium tin oxide (ITO) is generally used in the electrode patterns 41 and 42 constituting the electrode pattern layer 40. It is known that ITO applied to a touch sensor easily cracks on a flexible substrate and has a sheet resistance of about 200 $\Omega$/square (sq) or about 100 $\Omega$/sq according to the product.

Sheet resistance of ITO can be adjusted according to a thickness thereof. To implement a touch sensor that has a high resolution and a small thickness, it is necessary to minimize sheet resistance. However, a reduction in sheet resistance results in a relative increase in the thickness of ITO, thus limiting a reduction in the thickness of a product. Also, when the thickness of ITO increases, transmittance is degraded, and the visibility of a film is degraded. Therefore, it is necessary to develop a new touch sensor fabrication method for reducing sheet resistance of an electrode pattern layer without increasing an ITO thickness, and thereby causing a touch sensor to have a high resolution, a large area, and a small thickness.

Further, when a touch sensor is fabricated by attaching a film layer on a substrate, the film layer may be deformed due to a high-temperature process, and a solution to this problem is necessary.

PRIOR-ART DOCUMENTS

Patent Documents (Patent Document 1) Korea Patent Publication No. 10-2015-0132689

(Patent Document 2) Korea Patent Publication No. 10-2015-0040865

SUMMARY OF THE INVENTION

Technical Problem

A technical objective of the present invention is not only to improve touch sensitivity by causing an electrode pattern layer to have a low sheet resistance, and but also to provide a high-performance film-type touch sensor that has a high resolution, a large area, and a small thickness, and a method of fabricating the same.

Another technical objective of the present invention is to provide a high-performance film-type touch sensor that can have a high resolution, a large area, and a small thickness due to touch sensitivity improved by causing an electrode pattern layer to have a low sheet resistance, and can be fabricated with a substrate of a hard material through a high-temperature process, and a method of fabricating the same.

Yet another technical objective of the present invention is to provide a high-performance film-type touch sensor that can be used as an auxiliary means for recognizing a user's fingerprint, and a method of fabricating the same.

Solution to Problem

A method of fabricating a high-performance film-type touch sensor according to an embodiment of the present invention includes: forming a separation layer on a substrate; forming an electrode pattern layer including first and second electrode patterns arranged on the separation layer in different directions, bridge electrode patterns, and pad electrode patterns; forming a protection layer on the electrode pattern layer; and bonding a protection film having one surface to which an adhesive layer is applied onto the protection layer, wherein one or more of the first and second electrode patterns are formed of a plurality of conductive layers to reduce sheet resistance.

The method according to the present invention may further include: separating the substrate from the separation layer; and bonding a base film onto one surface of the separation layer from which the substrate has been separated.

The method may further include forming a protection layer between the separation layer and the electrode pattern layer.

In some cases, the method may further include removing the protection film and attaching a polarizer film.

In the method, the plurality of conductive layers may include a transparent metal oxide layer and a thin-film metal layer formed on or under the transparent metal oxide layer, and may have a sheet resistance of 10 $\Omega$/square (sq) or less and a transmittance of 85% or more.

The plurality of conductive layers may include a transparent metal oxide layer and a thin-film metal layer formed on or under the transparent metal oxide layer, the transparent metal oxide layer and the thin-film metal layer may have thicknesses of 10 nm to 40 nm and 5 nm to 20 nm respectively, and an electrode pattern interval may be 70 μm or less.

A high-performance film-type touch sensor according to an embodiment of the present invention is a film-type touch sensor which is peeled off from a substrate and to which a base film is bonded, wherein at least a separation layer, an electrode pattern layer, and a protection layer are sequentially stacked on the base film, and one or more of first and second electrode patterns arranged in different directions on the separation layer are formed of a plurality of conductive layers to reduce sheet resistance.

In a high-performance film-type touch sensor according to an embodiment of the present invention that can be modified, at least a separation layer, an electrode pattern layer, and a protection layer are sequentially stacked on a substrate, and one or more of first and second electrode patterns arranged in different directions on the separation layer are formed of a plurality of conductive layers to reduce sheet resistance.

As another embodiment that can be modified, in a high-performance film-type touch sensor according to an embodiment of the present invention, at least a separation layer, an electrode pattern layer, a protection layer, and a protection film are sequentially stacked on a substrate, and one or more of first and second electrode patterns arranged in different directions on the separation layer are formed of a plurality of conductive layers to reduce sheet resistance.

The plurality of conductive layers may include a transparent metal oxide layer and a thin-film metal layer formed on or under the transparent metal oxide layer, the transparent metal oxide layer and the thin-film metal layer may have thicknesses of 10 nm to 40 nm and 5 nm to 20 nm respectively, and an electrode pattern interval may be 70 μm or less.

The plurality of conductive layers may include a transparent metal oxide layer and a thin-film metal layer formed on or under the transparent metal oxide layer, and may have a sheet resistance of 10 Ω/sq or less and a transmittance of 85% or more.

In another embodiment that can be modified, the plurality of conductive layers may include a thin-film metal layer formed between transparent metal layers, and may have a sheet resistance of 10 Ω/sq or less and a transmittance of 85% or more.

Advantageous Effects

In a high-performance film-type touch sensor according to an embodiment of the present invention, an electrode pattern layer is implemented as a plurality of conductive layers, and thus it is possible to obtain a low sheet resistance of 10 Ω/square (sq) or less and a transmittance of 85% or more.

In addition, the present invention does not only improve touch sensitivity by causing an electrode pattern layer to have a low sheet resistance, but also provides a high-performance film-type touch sensor that can have a high resolution, a large area, and a small thickness. Due to improved touch sensitivity, the high-performance film-type touch sensor can be used as an auxiliary means for recognizing a user's fingerprint by identifying fingerprint ridges, and thus can be used as a fingerprint recognition touch sensor.

Further, the high-performance film-type touch sensor according to an embodiment of the present invention can be applied in a high-temperature process because it can be fabricated by forming a separation layer and an electrode pattern layer on a hard substrate, such as a glass substrate, without a film layer.

BRIEF DESCRIPTION OF DRAWINGS

FIG. 4 is a table showing an example of sheet resistance and transmittance features of a plurality of conductive layers according to an embodiment of the present invention.

DETAILED DESCRIPTION OF THE INVENTION

Figure 1:
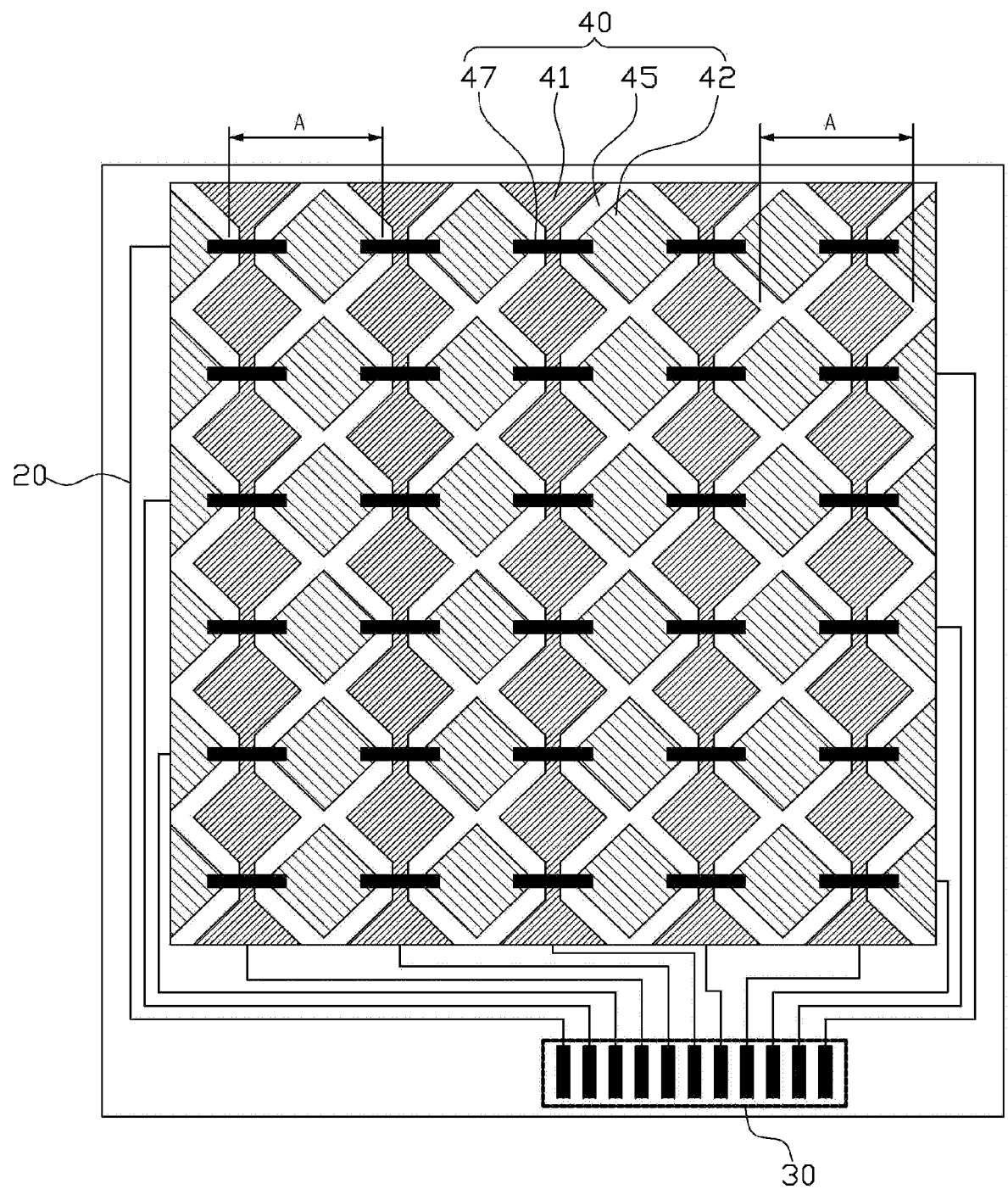
FIG. 1 is an example of a plan view of a general touch sensor.

As specific structural or functional descriptions for the embodiments according to the concept of the invention disclosed herein are merely exemplified for purposes of describing the embodiments according to the concept of the invention, the embodiments according to the concept of the invention may be embodied in various forms but are not limited to the embodiments described herein.

While the embodiments of the present invention are susceptible to various modifications and alternative forms, specific embodiments thereof are shown by way of example in the drawings and will herein be described in detail. It should be understood, however, that there is no intent to limit the invention to the particular forms disclosed, but on the contrary, the invention is to cover all modifications, equivalents, and alternatives falling within the spirit and scope of the invention.

Also, in describing embodiments of the present invention, when a detailed description of related known functions and configurations (e.g., a shape of an electrode pattern, a fabrication method of an electrode pattern, etc.) is determined to unnecessarily obscure the spirit of the present invention, the detailed description thereof will be omitted. In addition, for convenience of description, embodiments of the present invention will be described with reference to only upper and lower configurations of an electrode pattern layer lying in a display region of the touch sensor shown in FIG. 1.

Figure 2:
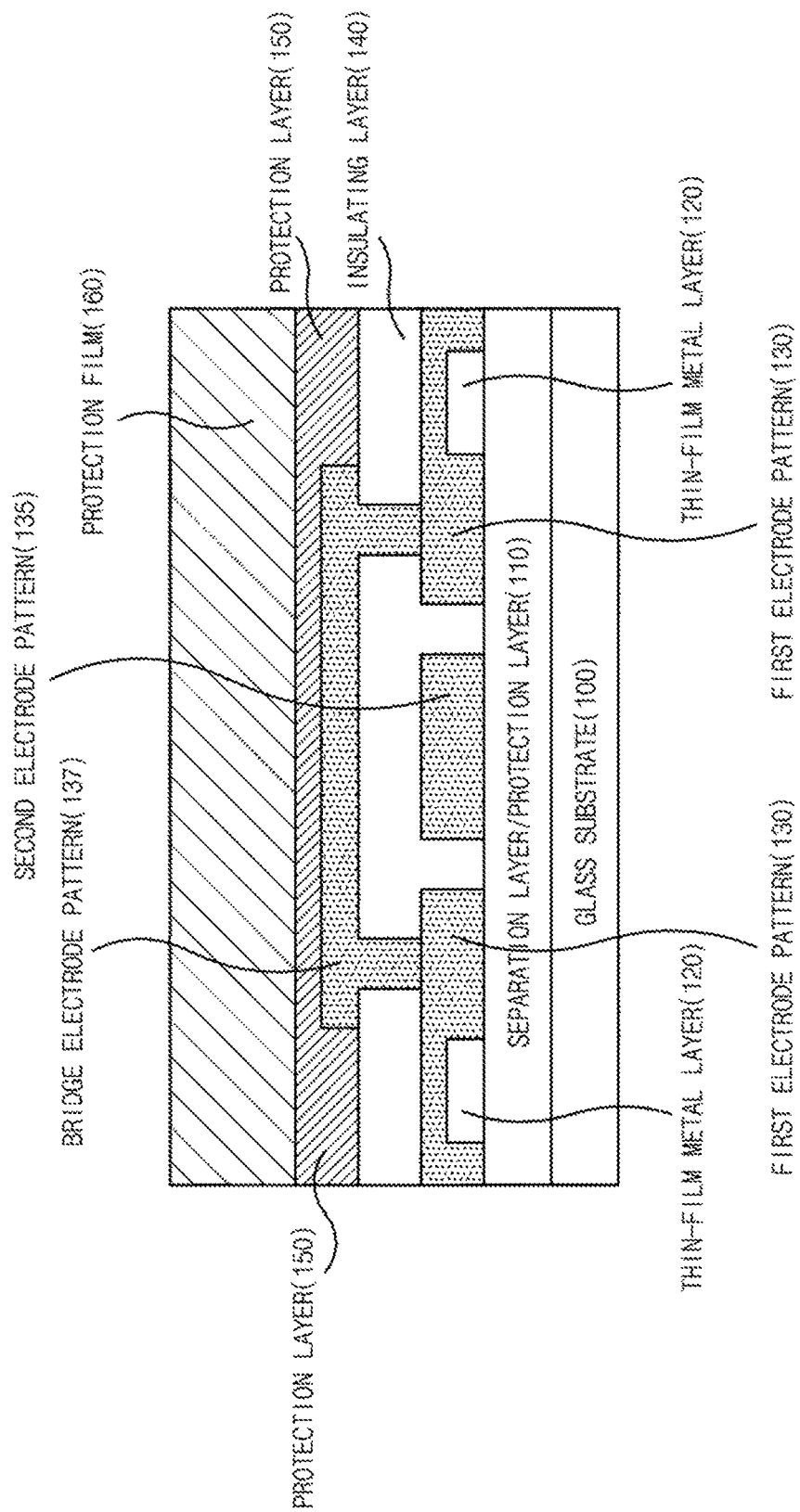
FIG. 2 is an example of a cross-sectional view of a high-performance film-type touch sensor according to an embodiment of the present invention.

First, FIG. 2 is an example of a cross-sectional view of a high-performance film-type touch sensor according to an embodiment of the present invention.

As shown in FIG. 2, in a high-performance film-type touch sensor according to an embodiment of the present invention, at least a separation layer 110, an electrode pattern layer 130, 135, 140, and 137, and a protection layer 150 are sequentially stacked on a hard substrate 100 such as a glass substrate, and one or more of the first and second electrode patterns 130 and 135 arranged in different directions on the separation layer 110 are formed of a plurality of conductive layers to reduce a sheet resistance.

The plurality of conductive layers include a transparent metal oxide layer that is the first electrode patterns 130 and a thin-film metal layer 120 formed on or under the transparent metal oxide layer. The transparent metal oxide layer and the thin-film metal layer 120 have thickness of 10 nm to 40 nm and 5 nm to 20 nm, respectively. An electrode pattern interval is 70 μm or less in consideration of an interval between fingerprint ridges (generally 50 μm to 200 μm), and may be 50 μm or less for precise detection.

Further, the plurality of conductive layers include the transparent metal oxide layer that is the first electrode patterns 130 and the thin-film metal layer 120 formed on or under the transparent metal oxide layer, and has a sheet resistance of 10 Ω/square (sq) or less and a transmittance of 85% or more.

According to embodiments, in the plurality of conductive layers, a thin-film metal layer (Ag alloy) is formed between the transparent metal oxide (indium zinc oxide (IZO) or indium tin oxide (ITO)) layer as shown in FIG. 4, which will be described below, and the plurality of conductive layers has a sheet resistance of 10 Ω/sq or less and a transmittance of 85% or more.

Any transparent conductive material can be used as the first electrode patterns 130 and the second electrode patterns 135 without limitation. The transparent metal oxide layer corresponding to the first electrode patterns 130 may include at least one of IZO, indium zinc tin oxide (IZTO), aluminum zinc oxide (AZO), gallium zinc oxide (GZO), fluorine tin oxide (FTO), ITO-Ag-ITO, IZO-Ag-IZO, and AZO-Ag-AZO, and the thin-film metal layer 120 may include at least one of Ag, Cu, Al, Pt, and Au. Needless to say, the thin-film metal layer 120 may be implemented as a nanowire of a metal such as Au, Ag, Cu, and Al, or a material selected from among conductive polymeric materials that can reduce sheet resistance.

The high-performance film-type touch sensor shown in FIG. 2 may further include a protection layer on the separation layer 110 as necessary. The glass substrate 100 may be removed through a peeling process, and a base film may be attached to the position. A protection film 160 may also be separated as necessary, and then a polarizer film may be attached for selling the touch sensor.

A fabrication process of the high-performance film-type touch sensor that can have such a variety of configurations will be described in detail below with reference to FIGS. 3A to 3F.

FIGS. 3A to 3F show an example of a fabrication process flow of a high-performance film-type touch sensor according to an embodiment of the present invention.

Figure 3A:
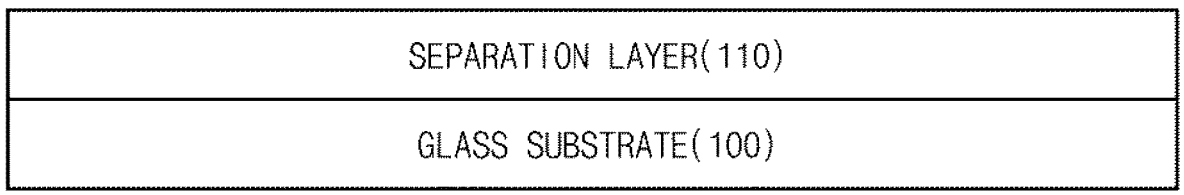
FIGS. 3A to 3F show an example of a fabrication process flow of a high-performance film-type touch sensor according to an embodiment of the present invention.

Referring to FIG. 3A, an organic polymer film is applied to the glass substrate 100 to form the separation layer 110. The separation layer 110 is formed to separate the touch sensor formed on the glass substrate 100 from the glass substrate 100. The separation layer 110 may surround and coat an electrode pattern layer formed thereon, and also function to insulate the electrode pattern layer.

For reference, a known coating method, such as spin coating, die coating, spray coating, or the like, may be used to apply the separation layer 110.

Peel strength of the separation layer 110 is not limited. The peel strength of the separation layer 110 may be, for example, 0.01N/25 mm to 1N/25 mm and may be preferably 0.01N/25 mm to 0.2N/25 mm. When the range is satisfied, the touch sensor can be easily peeled off from the glass substrate 100 without residue in the fabrication process of the touch sensor, and it is possible to reduce curls and cracks caused by tension generated during the peeling operation.

A thickness of the separation layer 110 is not limited. The thickness of the separation layer 110 may be, for example, 10 nm to 1,000 nm and may preferably be 50 nm to 500 nm.

When the range is satisfied, peel strength is stabilized, and uniform patterns can be formed.

The separation layer 110 may be made from a polymer such as a polyimide polymer, a polyvinyl alcohol polymer, a polyamic acid polymer, a polyamide polymer, a polyethylene polymer, a polystyrene polymer, a polynorbornene polymer, a phenylmaleimide copolymer polymer, and a polyazobenzene polymer, and the polymers may be used solely or in combination.

Meanwhile, in addition to the glass substrate 100, a substrate of a hard material that, in order to withstand a processing temperature for forming the touch sensor, is not deformed at high temperature, or in other words has heat tolerance so as to maintain its flatness, may be used as a base substrate.

As a curing process for forming the separation layer 110, thermal curing and ultraviolet (UV) curing may be used solely or in combination.

Figure 3B:
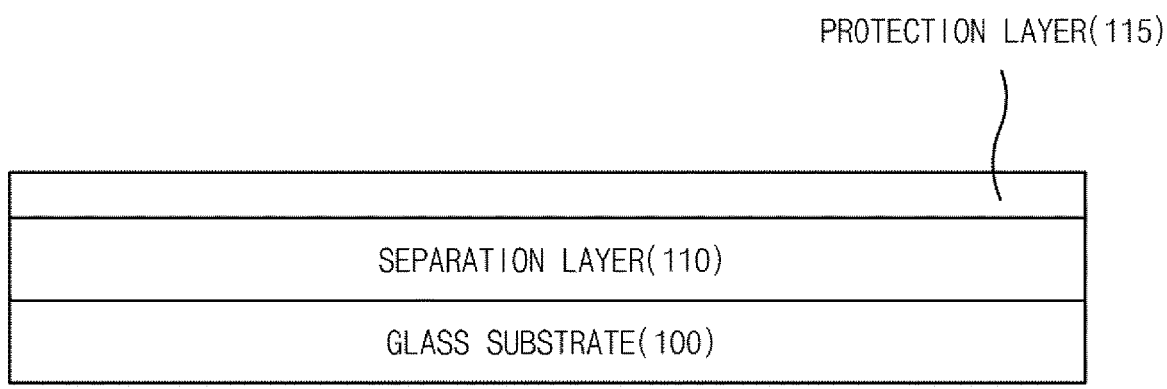

In the high-performance film-type touch sensor according to an embodiment of the present invention, after the separation layer 110 is formed, a protection layer 115 may be additionally formed on the separation layer 110 as shown in FIG. 3B. The protection layer 115 is an optional component that may be omitted as necessary.

The protection layer 115 functions to protect an electrode pattern layer, which will be described below, by coating the electrode pattern layer together with the separation layer 110, and to prevent the separation layer 110 from being exposed to an etchant for forming the electrode pattern layer in an operation of forming the electrode pattern layer.

For example, the protection layer 115 may be formed to cover at least partial regions of sides of the separation layer 110. The sides of the separation layer 110 indicate sidewalls of the separation layer 110. Such a configuration can minimize exposure of the sides of the separation layer 110 to the etchant and the like during a patterning process and the like of conductive electrode patterns constituting the electrode pattern layer. In order to completely prevent exposure of the sides of the separation layer 110, it is preferable to configure the protection layer 115 to cover the entirety of the sides of the separation layer 110. An index matching layer (IML) layer for adjusting a refractive index may be additionally formed on the separation layer 110 or the protection layer 115.

Figure 3C:
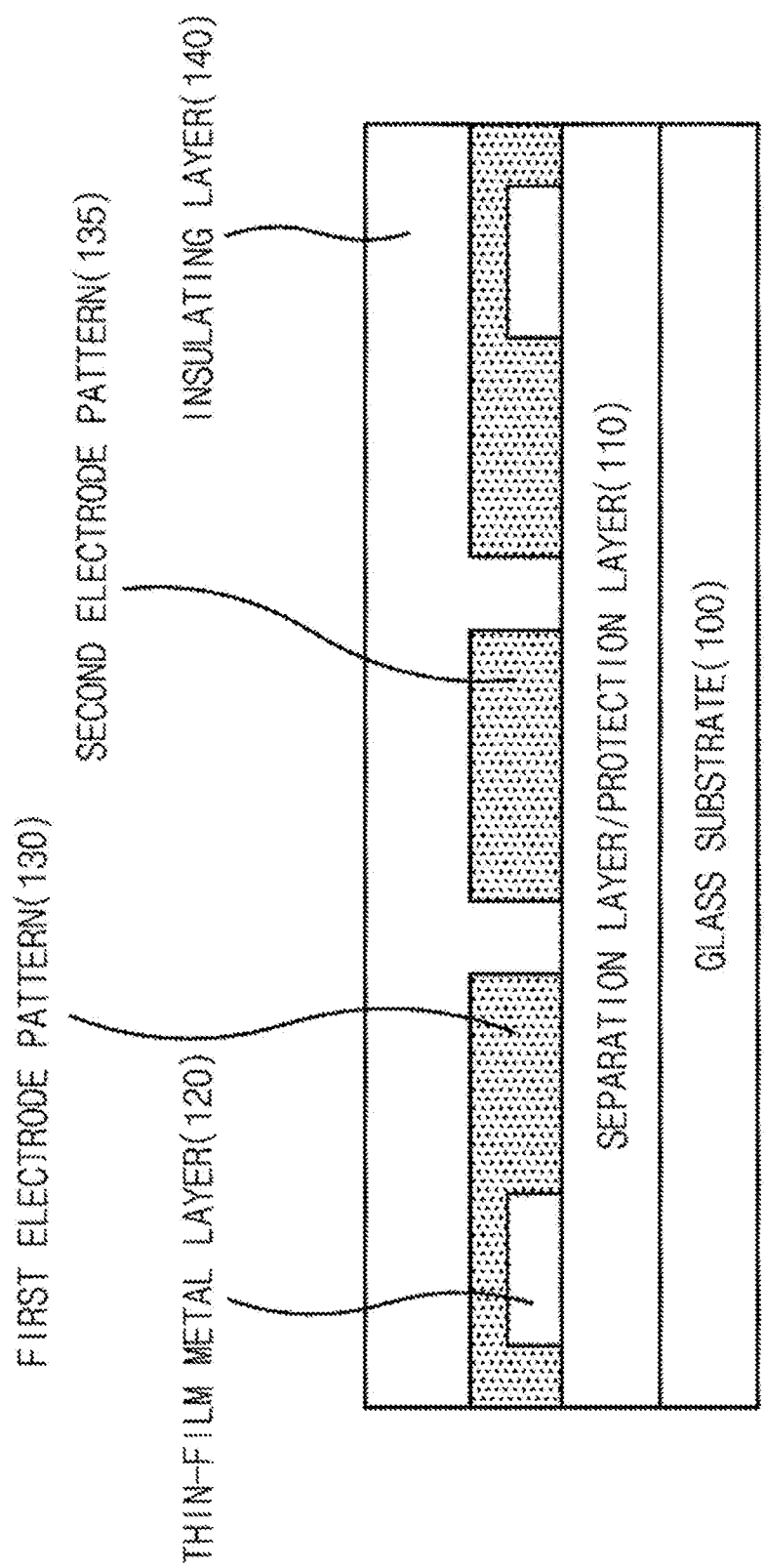

In the operation of forming the electrode pattern layer, as shown in FIG. 3C, a process of forming the electrode pattern layer on the separation layer 110 (or the protection layer 115) is performed. The electrode pattern layer is a component for sensing a touch signal input by a user. In an embodiment of the present invention, the electrode pattern layer includes the first and second electrode patterns 130 and 135 arranged in different directions (e.g., an x-axis direction and a y-axis direction), the bridge electrode patterns 137, pad electrode patterns, and the insulating layer 140. In particular, to reduce sheet resistance, one or more of the first and second electrode patterns 130 and 135, that is, the first electrode patterns 130 in an embodiment of the present invention, are formed as a plurality of conductive layers (e.g., a transparent metal oxide layer and a thin-film metal layer (corresponding to an auxiliary electrode)). In FIG. 3C, the first electrode patterns 130 are implemented with ITO (or IZO), which is a transparent metal oxide, and thus the reference number 130 can be used below as a reference number of the transparent metal oxide layer.

As described above with reference to FIG. 3C, to reduce an electric resistance, the electrode pattern layer includes a plurality of conductive layers, that is, the thin-film metal layer 120 and the transparent metal oxide layer 130 stacked on the thin-film metal layer 120. Needless to say, the thin-film metal layer 120 may be stacked on the transparent metal oxide layer 130, or the thin-film metal layer 120 may be formed between transparent metal oxide layers 130, that is, an electrode pattern layer having a three-layer structure such as a thin-film metal layer may be formed on a transparent metal oxide layer and a transparent metal oxide layer may be formed on the thin-film metal layer.

More specifically, as the electrode pattern layer in which the thin-film metal layer 120 is formed under the transparent metal oxide layer 130, the thin-film metal layer 120 corresponding to the auxiliary electrode is first deposited to be thin and semi-transparent on the separation layer 110 or the protection layer 115 and photo-etched such that the semi-transparent thin-film metal layer 120 is formed. Subsequently, the transparent metal oxide layer 130 is deposited on the thin-film metal layer 120 and photo-etched such that electrodes are formed. Since other processes for forming the electrode pattern layer, that is, a process of forming the insulating layer 140 and holes and a process of forming the bridge electrode patterns 137, are known techniques, a detailed description thereof will be omitted.

When the thin-film metal layer 120 is formed on the transparent metal oxide layer 130, the transparent metal oxide layer 130 and the thin-film metal layer 120 may be formed on the separation layer 110 or the protection layer 115, and then only the upper thin-film metal layer 120 may be selectively etched.

When the transparent metal oxide layer 130 is patterned into diamond patterns and the thin-film metal layer 120 is patterned into a mesh in the above-described electrode pattern layer, the thin-film metal layer 120 can be used as an auxiliary electrode. When the thin-film metal layer 120 able to be used as an auxiliary electrode is formed on the transparent metal oxide layer 130, sheet resistance is reduced such that a large-area and high-sensitivity sensor can be fabricated. For reference, when the auxiliary electrode is formed, a sheet resistance of the transparent metal oxide layer 130 is reduced by 60% to 90% or more. Therefore, it is preferable to adjust the thickness of the thin-film metal layer 120 so that the transparent metal oxide layer 130 has a sheet resistance of 10 Ω/sq or less and a transmittance of 85% or more.

The plurality of conductive layers constituting the first electrode patterns 130 has a sheet resistance of 10 Ω/sq or less and a transmittance of 90% or more. To have the sheet resistance, the transparent metal oxide layer 130 constituting the plurality of conductive layers and the thin-film metal layer 120 formed on or under the transparent metal oxide layer 130 preferably have thicknesses of 10 nm to 40 nm and 5 nm to 20 nm respectively, and an electrode pattern interval (A of FIG. 1) is preferably 70 μm or less and, for precise detection, 50 μm or less. This is for allowing normal sensing of the interval between fingerprint ridges.

For reference, FIG. 4 is a table showing an example of sheet resistance and transmittance features of a plurality of conductive layers according to an embodiment of the present invention. FIG. 4 shows an example of sheet resistance and transmittance features of a plurality of conductive layers having a three-layer structure in which the thin-film metal layer 120 is formed between transparent metal oxide layers 130.

Referring to FIG. 4, when the transparent metal oxide layers 130 were implemented as a plurality of conductive layers with IZO or ITO having a thickness of 30 nm and Ag having a thickness of 10 nm or 15 nm was used as the thin-film metal layer 120, the sheet resistance had a value of 10 Ω/sq or less, and a 3 μm or 5 μm IZO/Ag alloy/IZO pattern had a transmittance of 90% or more. Accordingly, when a plurality of conductive layers are formed to have a three-layer structure, it is possible to minimize the thickness of the plurality of conductive layers and obtain an excellent semi-transparent transmittance.

Meanwhile, the first electrode patterns 130 and the second electrode patterns 135 constituting the electrode pattern layer and a pad pattern layer may be formed on the protection layer 115 or the separation layer 110 using a plurality of known methods, for example, dry processes such as sputtering, deposition, and the like and wet processes such as deep coating, spin coating, roll coating, spray coating, and the like, and then patterned through a laser process or a wet etching process. Alternatively, the first electrode patterns 130, the second electrode patterns 135, and the pad pattern layer may be formed using a direct patterning process such as screen printing, gravure printing, inkjet printing, and the like.

In an embodiment of the present invention, the thin-film metal layer 120 and the transparent metal oxide layer 130 are consecutively deposited. Here, pads may be formed by photo-etching the thin-film metal layer 120, and first electrode patterns serving as touch sensors may be formed by photo-etching the transparent metal oxide layer 130.

When the first electrode patterns 130 and the second electrode patterns 135 are formed, the insulating layer 140 is formed as shown in FIG. 3C. The insulating layer 140 serves to prevent corrosion of the electrode patterns and protect surfaces of the electrode patterns. The insulating layer 140 is preferably a thermosetting or UV-curable organic polymer.

Figure 3D:
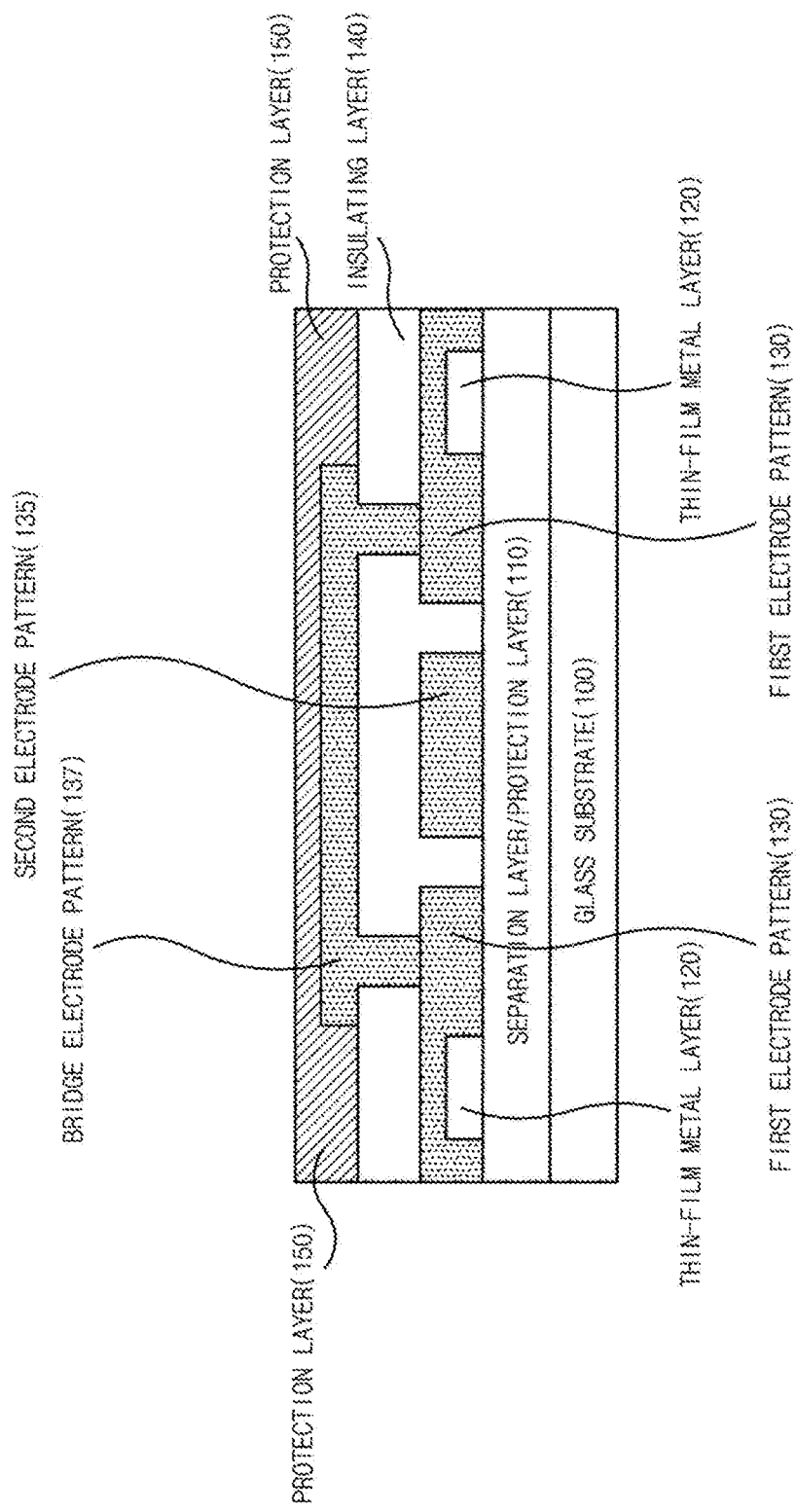

After the insulating layer 140 is formed, holes are formed in the insulating layer 140 as shown in FIG. 3D such that the first electrode patterns 130 are electrically connected. Also, a transparent conductive film is deposited in the holes and on the insulating layer 140 and photo-etched such that the bridge electrode patterns 137 are formed.

After the bridge electrode patterns 137 are formed, the protection layer 150 is formed as shown in FIG. 3D. The protection layer 150 is an organic film and formed so that a surface opposite to a surface coming in contact with the electrode pattern layer is flat. The protection layer 150 may be formed of a single layer or a plurality of layers, and is preferably formed from a material or a substance having the same refractive index as the insulating layer 140.

Figure 3E:
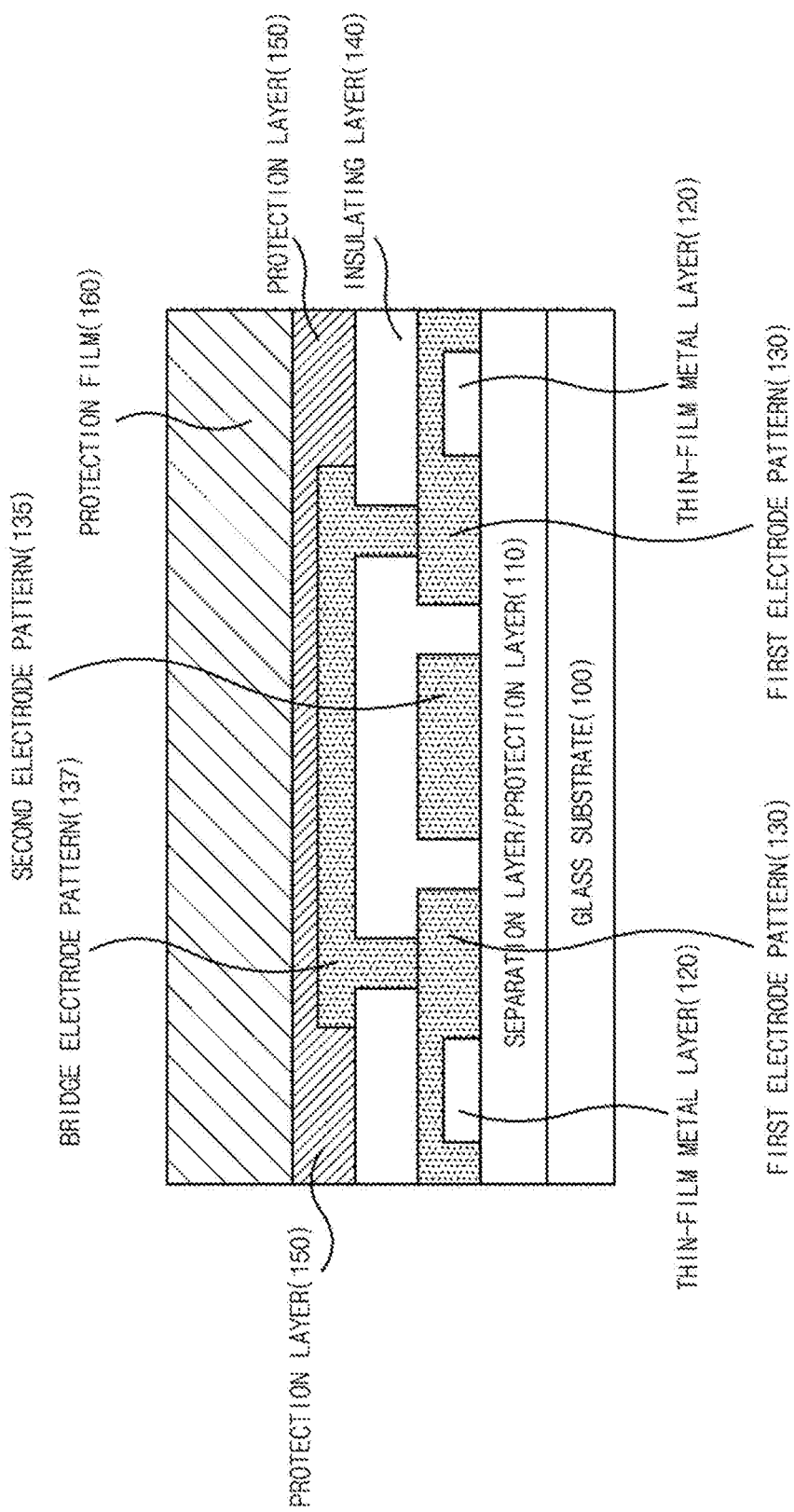

Subsequently, as shown in FIG. 3E, the protection film 160 is bonded onto the protection layer 150 through a transfer process. The protection film 160 may be a film including an adhesive layer on at least one surface thereof or a film having self-adhesiveness such as polypropylene, and may be used to improve processability. In some cases, the protection layer 150 may be removed, and then a polarizer film may be attached.

Figure 3F:
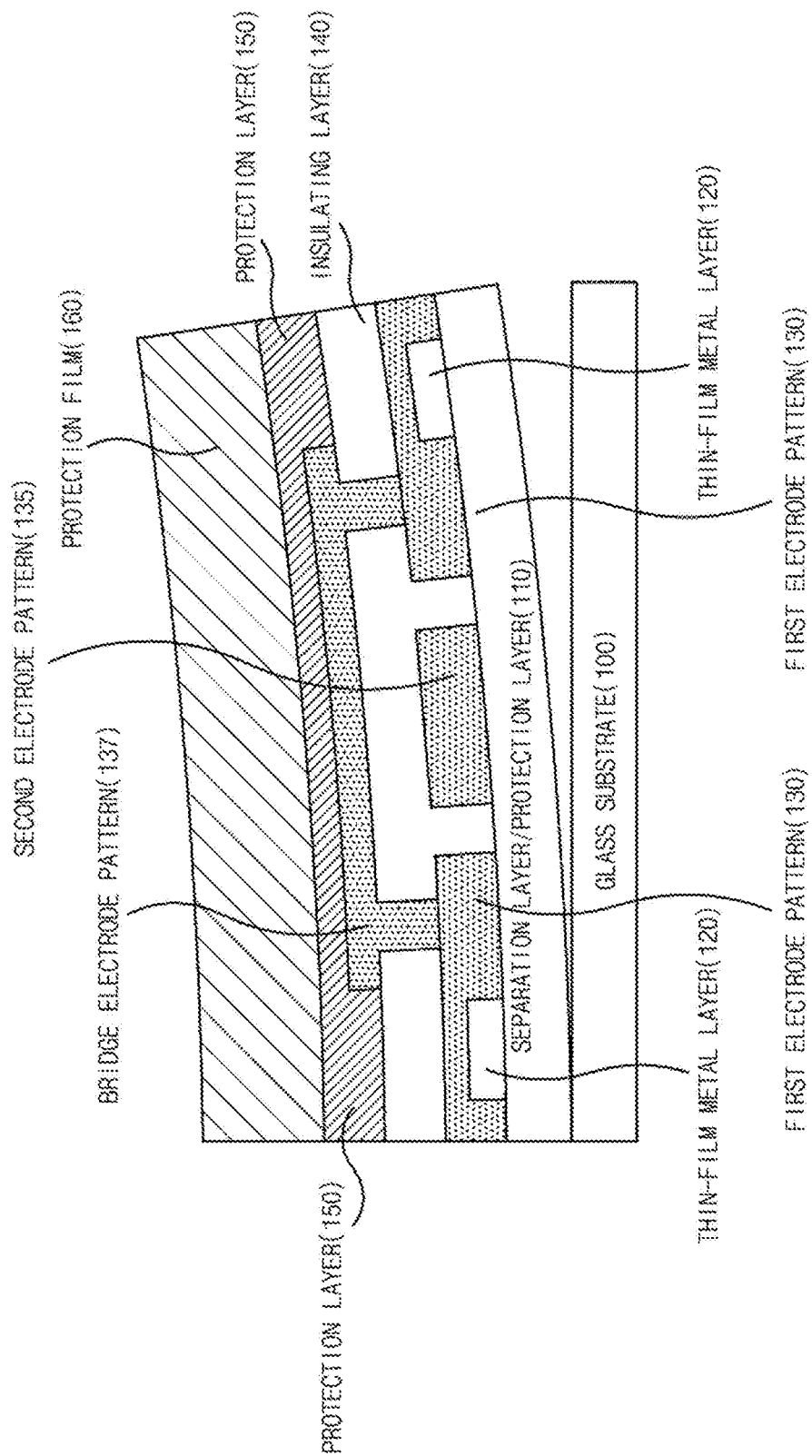

When bonding of the protection film 160 is completed, an operation of removing the glass substrate 100 is performed. In other words, the separation layer 110 on which the electrode pattern layer is formed may be peeled off and separated from the glass substrate 100 as shown in FIG. 3F. A peeling method may be lift-off or peel-off and is not limited thereto.

A base film may be bonded onto a lower surface of the separation layer 110 from which the glass substrate 100 has been removed. The film-type touch sensors to which the base film is bonded is subjected to a UV curing or thermal curing process, and the protection film 160 lying on the touch sensors is provided. Subsequently, a punched polarizer film is attached to the touch sensors, and the touch sensors are cut into cells such that high-performance touch sensors are fabricated in units of cells.

A high-performance film-type touch sensor that can be fabricated in the way described above according to an embodiment of the present invention can be sold as a touch sensor that has a variety of configurations according to demands of consumers or sales policies of manufacturers.

For example, a touch sensor which is peeled off from a glass substrate and to which a base film is bonded can be sold as a touch sensor in which at least a separation layer, an electrode pattern layer, and a protection layer are sequentially stacked on the base film and one or more of first and second electrode patterns arranged in different directions on the separation layer are formed of a plurality of conductive layers to reduce sheet resistance.

Also, the high-performance film-type touch sensor can be sold as a touch sensor in which at least a separation layer, an electrode pattern layer, and a protection layer are sequentially stacked on a glass substrate and one or more of first and second electrode patterns arranged in different directions on the separation layer are formed of a plurality of conductive layers to reduce sheet resistance.

Further, the high-performance film-type touch sensor can be sold as a touch sensor in which at least a separation layer, an electrode pattern layer, a protection layer, and a protection film are sequentially stacked on a glass substrate and one or more of first and second electrode patterns arranged in different directions on the separation layer are formed of a plurality of conductive layers to reduce sheet resistance.

In addition to such a variety of sale models, the high-performance film-type touch sensor can be sold as a model in which a protection layer is further stacked on a separation layer or a model in which a polarizer film is additionally bonded onto a protection layer stacked on an electrode pattern layer, as necessary.

As described above, a high-performance film-type touch sensor according to an embodiment of the present invention is fabricated by forming a separation layer and an electrode pattern layer on a glass substrate without a film layer, and thus can be applied in a high-temperature process. Also, since the electrode pattern layer is implemented as a plurality of conductive layers, the touch sensor can have a sheet resistance of 10 Ω/sq or less and a transmittance of 85% or more.

Therefore, the present invention can not only improve touch sensitivity by causing an electrode pattern layer to have a low sheet resistance, but can also provide a high-performance film-type touch sensor that has a high resolution, a large area, and a small thickness.

Also, the present invention can improve touch sensitivity and thus can be used as an auxiliary means for recognizing a user's fingerprint by identifying fingerprint ridges.

Although embodiments shown in the drawings have been described above for reference, the embodiments are merely exemplary, and those of ordinary skill in the art should appreciate that various modifications and equivalents can be made from the embodiments. Therefore, the true technical scope of the present invention should be determined only by the appended claims.

The invention claimed is:

1. A method of fabricating a high-performance film-type touch sensor, the method comprising:
forming a separation layer on a substrate;
forming an electrode pattern layer including first and second electrode patterns arranged on the separation layer in different directions, bridge electrode patterns, and pad electrode patterns;
forming a protection layer on the electrode pattern layer; and
bonding a protection film having one surface to which an adhesive layer is applied onto the protection layer,
wherein one or more of the first and second electrode patterns are formed of a plurality of conductive layers to reduce a sheet resistance,
wherein the plurality of conductive layers include a transparent metal oxide layer and a thin-film metal layer formed on or under the transparent metal oxide layer or between the transparent metal oxide layers,
wherein the conductive layer has a sheet resistance of 10μ/square (sq) or less and a transmittance of 85% or more.

2. The method according to claim 1,
the transparent metal oxide layer and the thin-film metal layer have thicknesses of 10 nm to 40 nm and 5 nm to 20 nm respectively, and
an electrode pattern interval is 70 μm or less.

3. The method according to claim 1,
wherein a transparent metal oxide layer constituting the plurality of conductive layers includes at least one of indium tin oxide (ITO), indium zinc oxide (IZO), indium zinc tin oxide (IZTO), aluminum zinc oxide (AZO), gallium zinc oxide (GZO), fluorine tin oxide (FTO), ITO-Ag-ITO, IZO-Ag-IZO, and AZO-Ag-AZO, and
a thin-film metal layer constituting the plurality of conductive layers includes at least one of Ag, Cu, Al, Pt, and Au.

4. The method according to claim 1, further comprising:
separating the substrate from the separation layer; and
bonding a base film onto one surface of the separation layer from which the substrate has been separated.

5. The method according to claim 4, further comprising:
forming a protection layer between the separation layer and the electrode pattern layer.

6. The method according to claim 4, further comprising:
removing the protection film and attaching a polarizer film.

7. A high-performance film-type touch sensor peeled off from a substrate and to which a base film is bonded,
wherein at least a separation layer, an electrode pattern layer, and a protection layer are sequentially stacked on the base film, and
one or more of first and second electrode patterns arranged in different directions on the separation layer are formed of a plurality of conductive layers to reduce sheet resistance,
wherein the plurality of conductive layers include a transparent metal oxide layer and a thin-film metal layer formed on or under the transparent metal oxide layer or between the transparent metal layers,
wherein the conductive layer has a sheet resistance of 10μ/square (sq) or less and a transmittance of 85% or more.

8. The high-performance film-type touch sensor according to claim 7,
the transparent metal oxide layer and the thin-film metal layer have thicknesses of 10 nm to 40 nm and 5 nm to 20 nm respectively, and
an electrode pattern interval is 70 μm or less.

9. The high-performance film-type touch sensor according to claim 7,
wherein a transparent metal oxide layer constituting the plurality of conductive layers includes at least one of indium tin oxide (ITO), indium zinc oxide (IZO), indium zinc tin oxide (IZTO), aluminum zinc oxide (AZO), gallium zinc oxide (GZO), fluorine tin oxide (FTO), ITO-Ag-ITO, IZO-Ag-IZO, and AZO-Ag-AZO, and a thin-film metal layer constituting the plurality of conductive layers includes at least one of Ag, Cu, Al, Pt, and Au.

10. The high-performance film-type touch sensor according to claim 7, further comprising: a polarizer film attached onto the protection layer.

11. The fingerprint recognition touch sensor according to claim 7, wherein a protection film is further stacked on a surface of the protection layer opposite to the electrode pattern layer.

12. A high-performance film-type touch sensor,
wherein at least a separation layer, an electrode pattern layer, and a protection layer are sequentially stacked on a substrate, and
one or more of first and second electrode patterns arranged in different directions on the separation layer are formed of a plurality of conductive layers to reduce sheet resistance,
wherein the plurality of conductive layers include a transparent metal oxide layer and a thin-film metal layer formed on or under the transparent metal oxide layer or between the transparent metal oxide layers,
wherein the conductive layer has a sheet resistance of 10μ/square (sq) or less and a transmittance of 85% or more.

13. A fingerprint recognition touch sensor which is a film-type touch sensor peeled off from a substrate and to which a base film is bonded,
wherein at least a separation layer, an electrode pattern layer, and a protection layer are sequentially stacked on the base film, and
one or more of first and second electrode patterns arranged in different directions on the separation layer are formed of a plurality of conductive layers to reduce sheet resistance,
wherein the plurality of conductive layers include a transparent metal oxide layer and a thin-film metal layer formed on or under the transparent metal oxide layer or between the transparent metal oxide layers,
wherein the conductive layer has a sheet resistance of 10μ/square (sq) or less and a transmittance of 85% or more.

14. A fingerprint recognition touch sensor touch sensor,
wherein at least a separation layer, an electrode pattern layer, a protection layer, and a protection film are sequentially stacked on a substrate, and
one or more of first and second electrode patterns arranged in different directions on the separation layer are formed of a plurality of conductive layers to reduce sheet resistance,
wherein the plurality of conductive layers include a transparent metal oxide layer and a thin-film metal layer formed on or under the transparent metal oxide layer or between the transparent metal oxide layers,
wherein the conductive layer has a sheet resistance of 10μ/square (sq) or less and a transmittance of 85% or more.

* * * * *